United States Patent
Nishimura et al.

(10) Patent No.: US 12,436,471 B2
(45) Date of Patent: Oct. 7, 2025

(54) CONTROL APPARATUS, LITHOGRAPHY APPARATUS, AND ARTICLE MANUFACTURING METHOD

(71) Applicant: CANON KABUSHIKI KAISHA, Tokyo (JP)

(72) Inventors: Mitsuhide Nishimura, Tochigi (JP); Junichi Motojima, Tochigi (JP); Tsutomu Terao, Tochigi (JP)

(73) Assignee: CANON KABUSHIKI KAISHA, Tokyo (JP)

(*) Notice: Subject to any disclaimer, the term of this patent is extended or adjusted under 35 U.S.C. 154(b) by 566 days.

(21) Appl. No.: 17/880,767

(22) Filed: Aug. 4, 2022

(65) Prior Publication Data
US 2023/0057796 A1    Feb. 23, 2023

(30) Foreign Application Priority Data
Aug. 20, 2021   (JP) .................. 2021-135028

(51) Int. Cl.
*G03F 7/00*    (2006.01)

(52) U.S. Cl.
CPC ................. *G03F 7/70725* (2013.01)

(58) Field of Classification Search
CPC ............. G03F 7/70725; G03F 7/70525; G03F 7/70775; G05B 11/42; G05B 13/042; G05B 13/024; G05B 13/048; G05B 13/04
See application file for complete search history.

(56) References Cited

U.S. PATENT DOCUMENTS

| | | | |
|---|---|---|---|
| 2005/0231706 A1 | 10/2005 | Yang | |
| 2007/0219647 A1* | 9/2007 | Heertjes | G05B 19/371 700/44 |
| 2008/0200998 A1* | 8/2008 | Baggen | G03F 7/70725 700/53 |
| 2013/0116814 A1 | 5/2013 | Yang | |
| 2021/0088914 A1* | 3/2021 | Nishimura | G03F 7/70525 |

FOREIGN PATENT DOCUMENTS

| | | |
|---|---|---|
| JP | 2005322720 A | 11/2005 |
| JP | 2013-218496 A | 10/2013 |
| JP | 2019-194777 A | 11/2019 |

(Continued)

OTHER PUBLICATIONS

1 Korean Office Action issued in corresponding KR Patent Application No. 10-2022-0097627 dated Nov. 27, 2024.

(Continued)

*Primary Examiner* — Steven H Whitesell
(74) *Attorney, Agent, or Firm* — Carter, DeLuca & Farrell LLP

(57) ABSTRACT

A control apparatus for performing position control of a moving object is provided. The apparatus includes a feedforward controller configured to perform feedforward control by giving a feedforward manipulated variable to the moving object. In a case that a duration of the feedforward control exceeds a predetermined time, the feedforward controller continues the feedforward control using a feedforward manipulated variable obtained based on a feedforward manipulated variable used in a predetermined section including an end of the predetermined time.

12 Claims, 14 Drawing Sheets

(56) References Cited

FOREIGN PATENT DOCUMENTS

| | | |
|---|---|---|
| JP | 2021-47306 A | 3/2021 |
| KR | 1020020093601 A | 12/2002 |
| KR | 1020070104272 A | 10/2007 |
| KR | 10-2021-0033895 A | 3/2021 |
| TW | 201734662 A | 10/2017 |
| WO | 2006075554 A1 | 7/2006 |

OTHER PUBLICATIONS

Taiwan Office Action issued in corresponding TW Patent Application No. 111129299 dated Dec. 5, 2024.

Notice of Reasons for Refusal issued by the Japanese Patent Office on Feb. 16, 2024 in corresponding JP Patent Application No. 2021-135028, with English translation.

Korean Notice of Allowance issued in corresponding KR Patent Application No. 10-2022-0097627, dated Aug. 18, 2025, with English translation.

\* cited by examiner

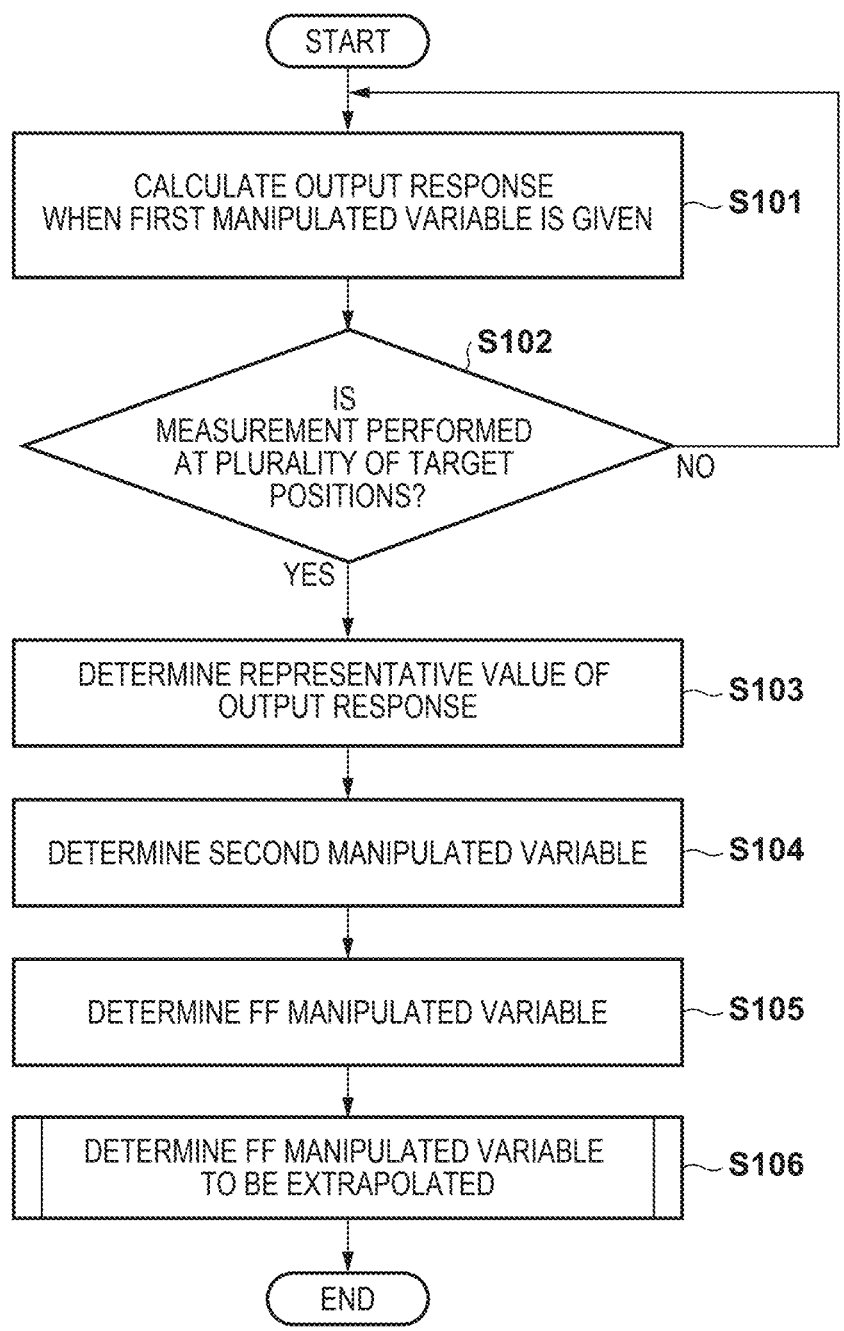

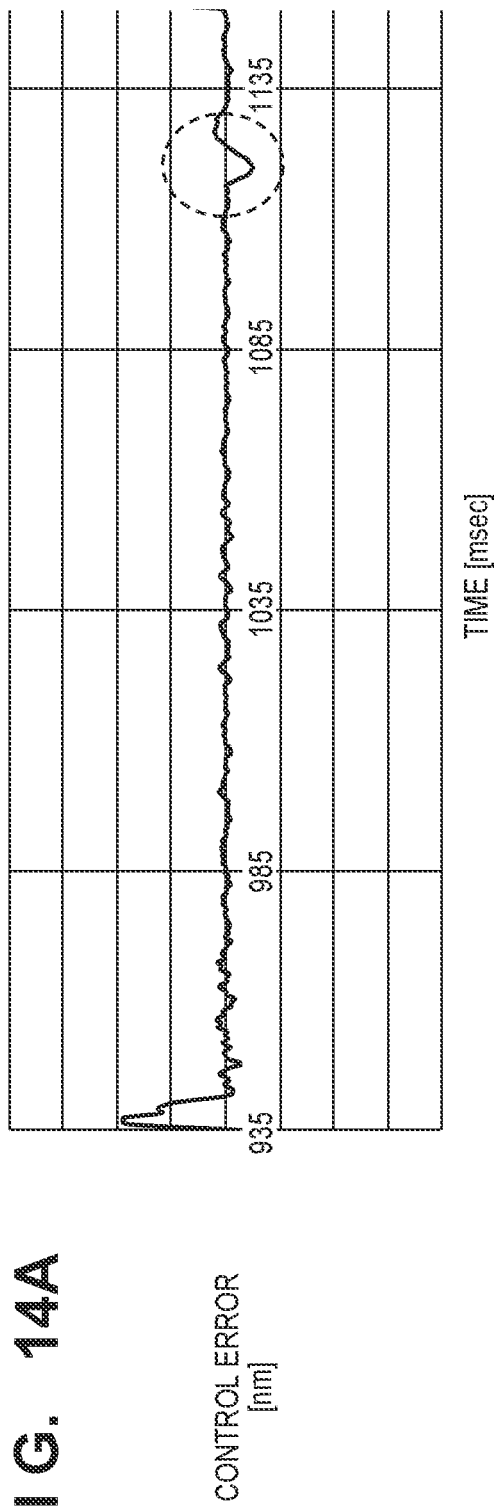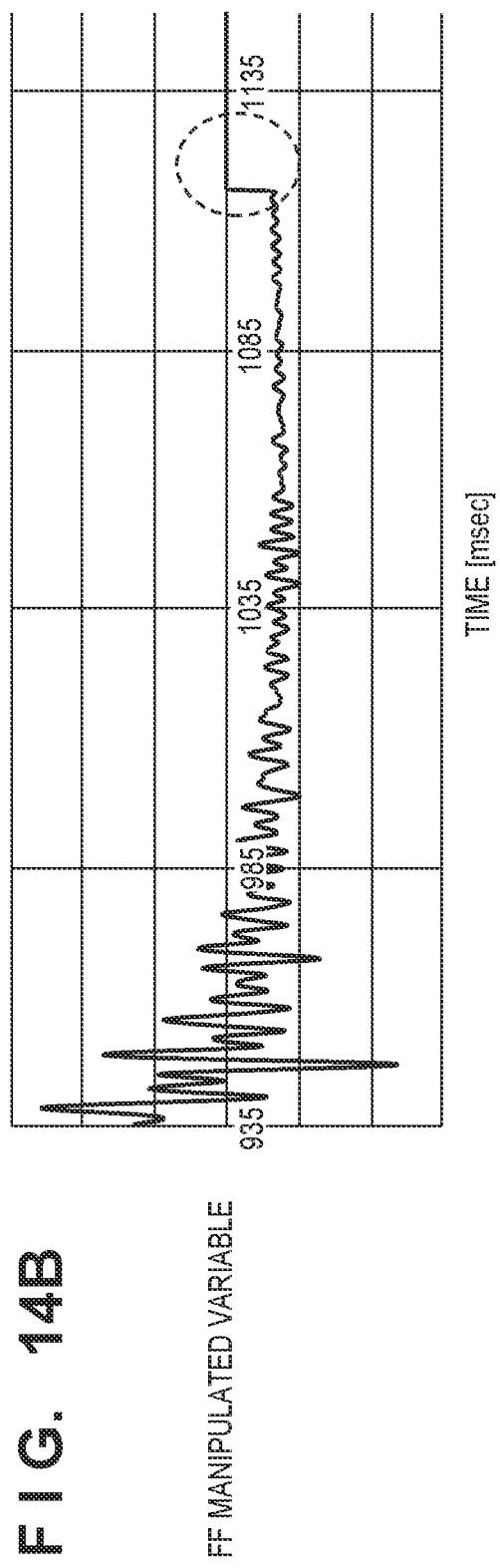

CONTROL APPARATUS, LITHOGRAPHY APPARATUS, AND ARTICLE MANUFACTURING METHOD

BACKGROUND OF THE INVENTION

Field of the Invention

The present invention relates to a control apparatus, a lithography apparatus, and an article manufacturing method.

Description of the Related Art

In a lithography apparatus such as an exposure apparatus used for the manufacture of a semiconductor device or the like, a feedback control system is generally configured for positioning, with high accuracy, a stage that holds a substrate (or an original). Some feedback control system gives a feedforward manipulated variable to a driving signal to increase the positioning speed. By giving the feedforward manipulated variable, a control error can be reduced quickly and throughput can be improved.

Japanese Patent Laid-Open No. 2013-218496 describes that a response of a substrate stage upon giving a predetermined manipulated variable such as an impulse signal to the substrate stage serving as a control target, and a feedforward manipulated variable is generated based on the measurement result.

For example, in an exposure apparatus, there can be a case in which a processing time after completion of movement of a substrate stage is long (for example, 200 msec or more). The processing time is determined in accordance with the operation method of the exposure apparatus, and a long processing time and a short processing time can be mixed. For example, exposure amount setting, alignment setting, and the like correspond to this.

The feedforward manipulated variable can be determined in advance for each shot region on a substrate and for each time series. Also, for a long processing time, it is desirable that a control error suppression state is continued by control. Therefore, it is necessary to store, in a memory, the feedforward manipulated variables corresponding to the number of shot regions×processing time for an exposure process, and the feedforward manipulated variables corresponding to the number of alignment shots×processing time for an alignment measurement process. In general, 100 or more shot regions are formed on one substrate. Accordingly, it is necessary to store at least 100 kinds of feedforward manipulated variables, and a problem can occur that the storage capacity for the manipulated variables will be insufficient.

The computer structure of an exposure apparatus is divided into multiple layers. If the layers are not taken into consideration, it is not difficult to secure a large capacity memory for storing the feedforward manipulated variables while assuming a long processing time. However, if the layers are taken into consideration, it is difficult to secure such a large capacity memory.

When the processing time is short, a moving time between the coordinates of the substrate stage (including the processing time after the movement) is extremely short (100 msec or less), and it is difficult to transfer, from an upper layer, a feedforward manipulated variable for a next target position during the processing time. Therefore, data required for control of the substrate stage is stored in a computer (memory) in a lower layer. However, since the memory capacity in the lower layer is limited, it is currently difficult to store 100 or more kinds of feedforward manipulated variables for the long processing time. On the other hand, if the layer for storing the feedforward manipulated variables is changed in accordance with the length of the processing time, the process becomes complicated.

Further, if a feedforward control duration exceeds an expected time (preset time) so that feedforward control expires, a control error occurs in a short time (for example, 5 to 10 msec). The control error in this case can be a larger control error (for example, 5 to 100 nm) than in a case in which the feedforward control is continued. Occurrence of the control error, as described above during alignment measurement or exposure, leads to a decrease in accuracy and a decrease in throughput. Therefore, this must be avoided.

SUMMARY OF THE INVENTION

The present invention provides a technique that can suppress a control error in a case in which feedforward control is continued for more than a preset time.

The present invention in its one aspect provides a control apparatus for performing position control of a moving object, the apparatus comprising a feedforward controller configured to perform feedforward control by giving a feedforward manipulated variable to the moving object, wherein in a case that a duration of the feedforward control exceeds a predetermined time, the feedforward controller continues the feedforward control using a feedforward manipulated variable obtained based on a feedforward manipulated variable used in a predetermined section including an end of the predetermined time.

Further features of the present invention will become apparent from the following description of exemplary embodiments (with reference to the attached drawings).

BRIEF DESCRIPTION OF THE DRAWINGS

FIG. 4 is a flowchart showing a method of determining a feedforward manipulated variable;

FIGS. 14A and 14B are graphs showing an example of a control error and an example of an FF manipulated variable, respectively, in a case in which FF control expires according to a related art.

DESCRIPTION OF THE EMBODIMENTS

Figure 1:
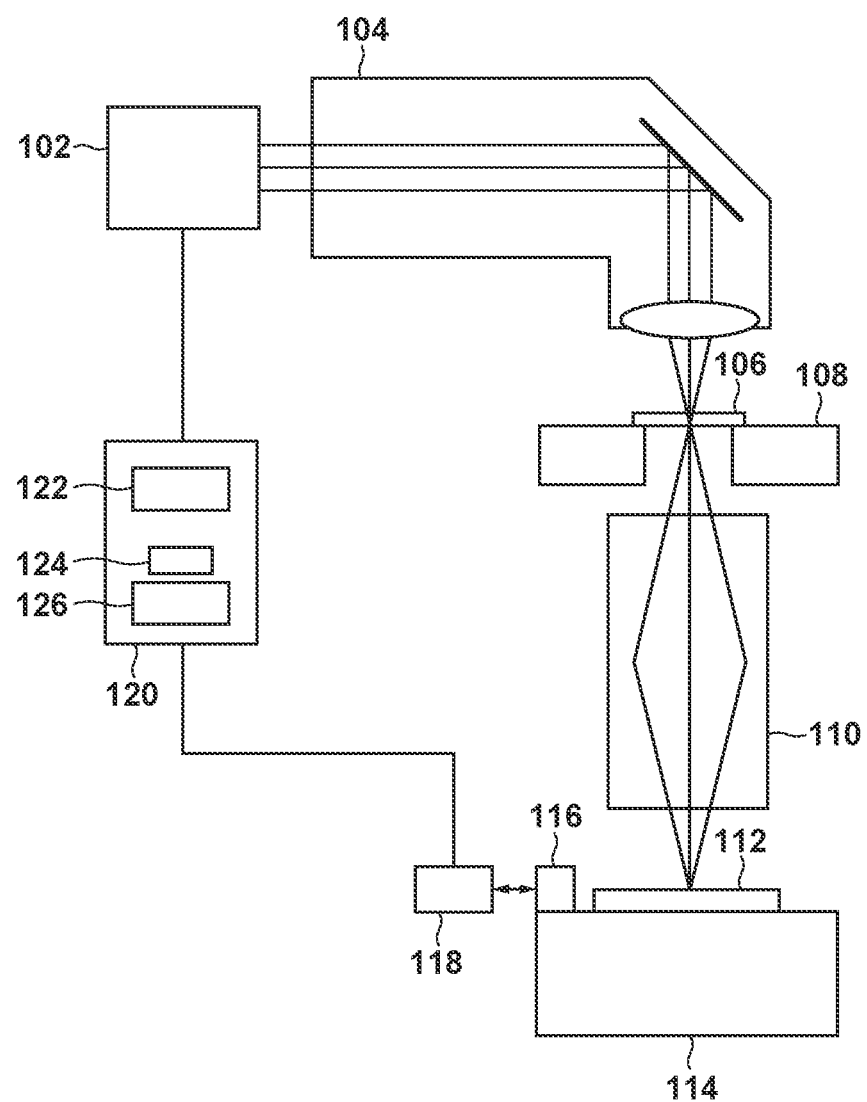
FIG. 1 is a view showing the arrangement of an exposure apparatus.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

In the following embodiments, the present invention will be described while taking, as an example, an exposure apparatus that transfers the pattern of a mask (original) onto a substrate, but the present invention is not limited to the exposure apparatus. For example, the present invention can also be applied to other lithography apparatus such as an imprint apparatus that forms the pattern of an imprint material on a substrate using a mold, or a drawing apparatus that forms a pattern on a substrate by irradiating the substrate with a charged particle beam. Further, the present invention is not limited to a lithography apparatus, and can be applied to any apparatus as long as it positions a control target. In addition, a substrate stage that can move while holding a substrate is described as a control target in the following embodiments, but even when a mask stage that can move while holding a mask (original) or the like is assumed to be a control target, the present invention can be applied.

FIG. 1 is a view showing the arrangement of an exposure apparatus in the embodiment. For example, the exposure apparatus can be a static exposure apparatus or the like that transfers the pattern of a mask (original) onto a substrate by a step-and-repeat method. Alternatively, a step-and-scan method or another exposure method may be applied to the exposure apparatus.

The exposure apparatus includes an illumination optical system 104 that illuminates a mask 106 with light from a light source 102, a mask stage 108 that holds the mask 106, and a projection optical system 110 that projects the pattern of the mask 106 onto a substrate. The exposure apparatus further includes a substrate stage 114 that can move while holding a substrate 112, a moving mirror 116, a laser interferometer 118, and a control apparatus 120.

As the light source 102, a light source such as an i-line light source with a wavelength of about 365 nm, a KrF excimer laser with a wavelength of about 248 nm, or an ArF excimer laser with a wavelength of 193 nm can be used. However, the type of the light source and the number of light sources are not particularly limited and, for example, an F2 laser with a wavelength of about 157 nm may be used as the light source 102.

The illumination optical system 104 is an optical system that illuminates the mask 106 with light from the light source 102. The illumination optical system 104 can include a beam shaping optical system for shaping the shape of light from the light source 102, an optical integrator for forming a plurality of secondary light sources for illuminating the mask 106 with a uniform illuminance distribution, and the like.

The mask 106 has a pattern to be transferred onto the substrate 112, and is held and driven by the mask stage 108. The light diffracted by (the pattern of) the mask 106 is projected onto the substrate 112 via the projection optical system 110. The mask 106 and the substrate 112 are arranged in an optically conjugate relationship. In this embodiment, since the exposure apparatus is a step-and-repeat exposure apparatus, the substrate stage 114 stops at each transfer position, and the pattern of the mask 106 is transferred onto the substrate 112.

The mask stage 108 includes a mask chuck for holding (chucking) the mask 106, and is configured to be movable in the X-axis direction, the Y-axis direction, the Z-axis direction, and the rotational direction of each axis.

The projection optical system 110 is an optical system that projects the pattern of the mask 106 onto the substrate 112. As the projection optical system 110, a refractive system, a catadioptric system, or a reflective system can be used.

The substrate 112 is a substrate onto which the pattern of the mask 106 is projected (transferred). A resist (photosensitive agent) is applied to the substrate 112, The substrate 112 can include a wafer, a glass plate, or any other substrate.

The substrate stage 114 includes a substrate chuck for holding (chucking) the substrate 112, and can include a substrate stage driving unit (not shown) for moving the substrate stage 114 in the X-axis direction, the Y-axis direction, the Z-axis direction, and the rotational direction of each axis. The moving mirror 116 is fixed to the substrate stage 114, and the position and speed of the substrate stage 114 are detected by the laser interferometer 118 using the moving mirror 116. That is, the laser interferometer 118 can function as a measurement unit that measures the position and speed of the substrate stage 114. The measurement unit can include a plurality of laser interferometers 118 such that the position and speed of the substrate stage 114 in the X-axis direction, the Y-axis direction, the Z-axis direction, and the rotational direction of each axis can be measured.

The control apparatus 120 is formed by, for example, a computer (information processing device) including a CPU and a memory 126, and controls the operation (whole) of the exposure apparatus 1 based on a computer program stored in the memory 126. For example, the control apparatus 120 performs position control of the substrate stage 114 serving as a moving object. The memory 126 of the control apparatus 120 is a storage unit that stores data related to control of the substrate stage 114. In this embodiment, the memory 126 can store a feedforward manipulated variable and the like given to the substrate stage 114 by a feedforward controller 124 as will be described later.

Figure 2A:
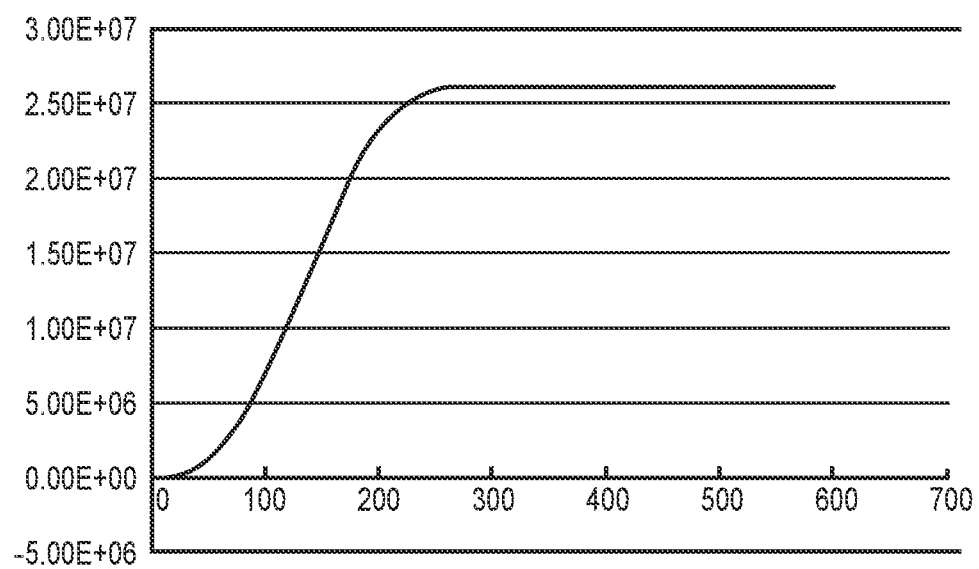
FIGS. 2A and 2B are graphs showing the time-series positions of a substrate stage and the time-series control errors, respectively.
Figure 2B:
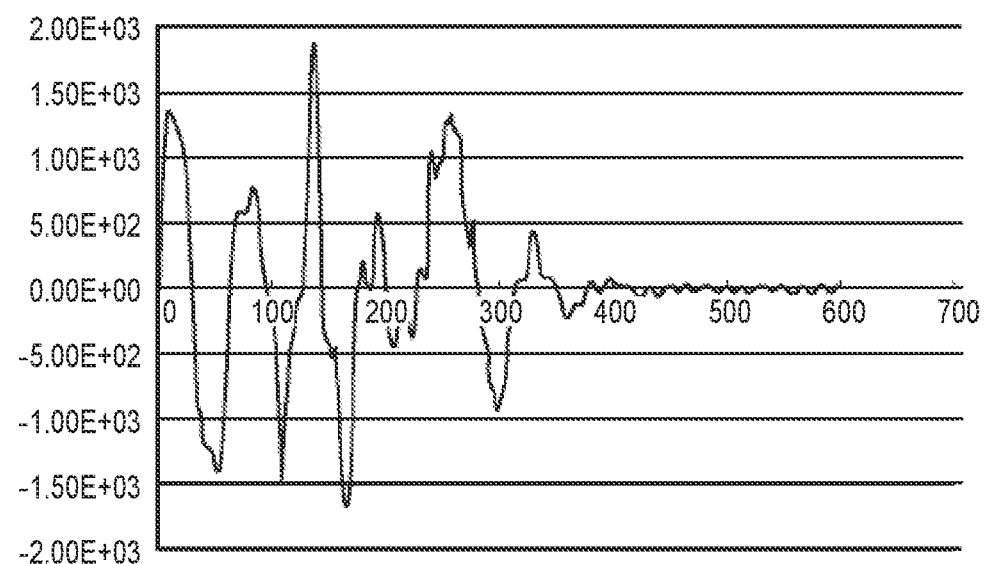

In the exposure apparatus, generally, feedback (FB) control of the substrate stage 114 can be performed so as to reduce the error between the current position of the substrate stage 114 and a target position. FIG. 2A is a graph showing the time-series positions of the substrate stage 114 obtained only when feedback control is performed, and FIG. 2B is a graph showing the time-series control errors (that is, the error between the current position of the substrate stage 114 and a target position) at that time. In FIG. 2A, the ordinate represents the position of the substrate stage 114, and the abscissa represents time. In FIG. 2B, the ordinate represents the position error of the substrate stage 114, and the abscissa represents time. In the following description, the position error of the substrate stage 114 may be referred to as a "control error".

Referring to FIG. 2A, it can be seen that the substrate stage 114 starts moving at time 0 and reaches almost the target position at around time 300. However, in practice, as shown in FIG. 2B, at around time 300, the control error of the substrate stage 114 remains, and it cannot be said that the substrate stage 114 has reached the target position completely. An exposure apparatus for manufacturing a semiconductor device is required to have an accuracy on the order of nanometer for positioning a substrate stage. Accordingly, in the example shown in FIGS. 2A and 2B, the time at which an exposure process can be started is after time 450 at which the control error of the substrate stage 114 is settled, which can be disadvantageous in terms of throughput.

Figure 3:
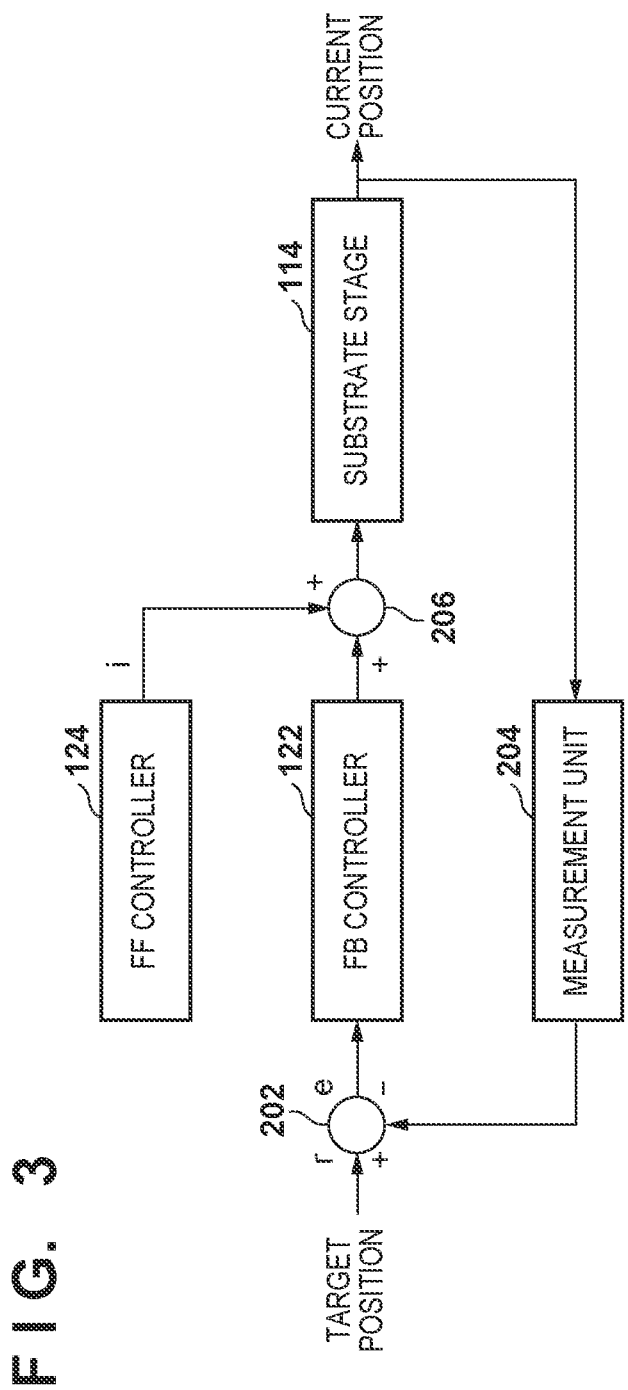
FIG. 3 is a block diagram showing position control of the substrate stage.

Therefore, the control apparatus 120 of this embodiment performs feedforward (FF) control of the substrate stage 114 (the substrate stage driving unit thereof (not shown)). FIG. 3 is a block diagram showing position control of the substrate stage 114 by the control apparatus 120. In FIG. 3 the control apparatus 120 includes the feedforward controller 124 for performing FF control of the substrate stage 114. The feedforward controller 124 performs feedforward control of the substrate stage 114 by giving a feedforward manipulated variable to the substrate stage 114 serving as a control target. In addition, in the example shown in FIG. 3, the control apparatus 120 includes a feedback controller 122 for performing feedback (FB) control of the substrate stage 114 (the substrate stage driving unit thereof (not shown)). The feedback controller 122 performs feedback control of the substrate stage 114 so as to reduce the error between the current position (output response) of the substrate stage 114 and a target position (target value). By combining the feedforward control and the feedback control, the positioning speed of the substrate stage 114 is expected to be improved. Here, in the control apparatus 120, the feedback controller 122 is not an essential component. The control apparatus 120 may also include a controller that performs another control such as sequence control.

A subtractor 202 calculates an error e between the current position of the substrate stage 114 measured by a measurement unit 204 including the laser interferometer 118 and a target position r, and outputs the error e to the feedback controller 122. The feedback controller 122 can include, for example, a PID (Proportional integral Differential) compensator. The PID compensator obtains a feedback manipulated variable for driving the substrate stage 114 so as to reduce the error calculated by the subtractor 202 (for example, to be zero) and gives the obtained feedback manipulated variable to the substrate stage 114. On the other hand, the feedforward controller 124 adds a feedforward manipulated variable i for reducing the control error of the substrate stage 114 to the feedback manipulated variable by an adder 206 and gives it to the substrate stage 114.

Next, a method of determining a feedforward manipulated variable to be given to the substrate stage 114 by the feedforward controller 124 will be described with reference to FIG. 4. FIG. 4 is a flowchart showing a method of determining a feedforward manipulated variable. Each step shown in FIG. 4 can be performed by the control apparatus 120 based on the computer program stored in the memory 126. Hereinafter, a feedforward manipulated variable may be referred to as an "FF manipulated variable" and a feedback manipulated variable may be referred to as an "FB manipulated variable".

Figure 5A:
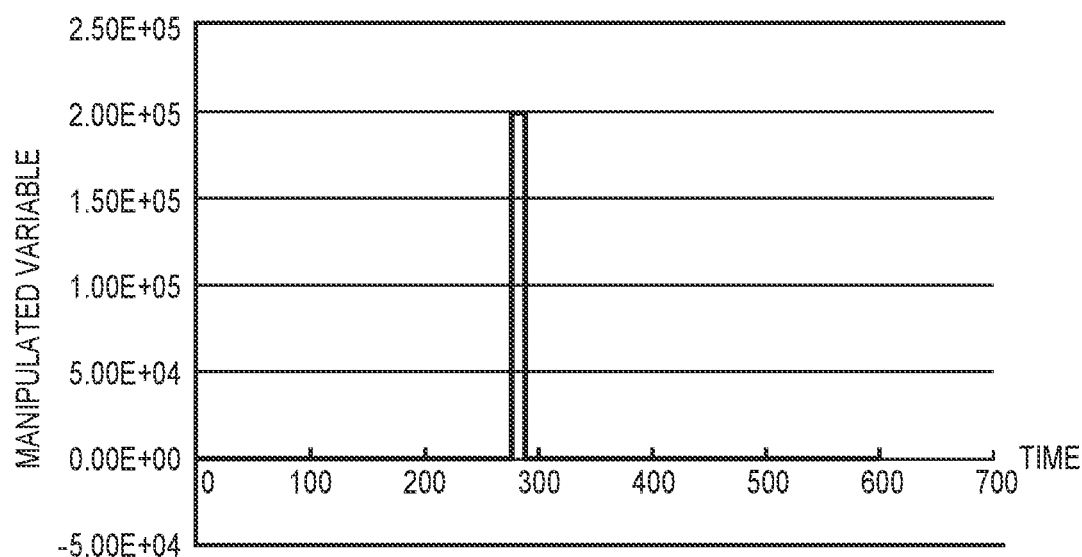
FIGS. 5A and 5B are graphs showing an example of a first manipulated variable and an example of the output response of the substrate stage, respectively.
Figure 5B:
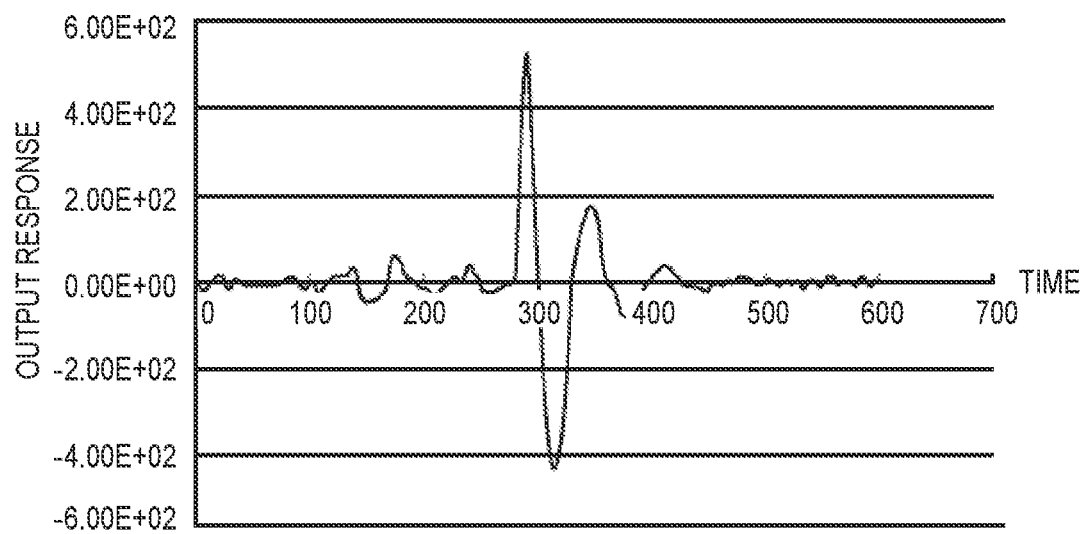

In step S101, the control apparatus 120 measures an output response of the substrate stage 114 obtained when a predetermined first manipulated variable is given as the FF manipulated variable. The first manipulated variable can be, for example, an impulse signal as shown in FIG. 5A. FIG. 5B shows an example of the output response (that is, the impulse response) to the impulse signal. In step S102, the control apparatus 120 determines whether the measurement result of the output response of the substrate stage 114 has been obtained for each of a plurality of target positions. The target position can be set at, for example, the position at which the substrate stage 114 is to be arranged when transferring the pattern of the mask 106 to a shot region on the substrate. In this case, the plurality of target positions may be set so as to include all the positions of the substrate stage 114 for performing pattern formation on a plurality of shot regions on the substrate. Alternatively, the plurality of target positions may be set so as to include only the positions of the substrate stage 114 for performing pattern formation on several shot regions (sample shot regions) out of the plurality of shot regions on the substrate. In step S102, if it is determined that the measurement result of the output response has been obtained for each of the plurality of target positions, the process advances to step S103. On the other hand, if there is any target position for which the measurement result of the output response has not been obtained, the process returns to step S101 and the substrate stage 114 is arranged at the target position to measure the output response.

In step S103, the control apparatus 120 determines a representative value of the output response obtained when the first manipulated variable is given to the substrate stage 114, based on the measurement result of the output response obtained at each of the plurality of target positions. In steps S104 to S106 to be described later, the control apparatus 120 may set an FF manipulated variable commonly used at the plurality of target positions, or may set an FF manipulated variable individually for each of the plurality of target positions. When setting an FF manipulated variable commonly used at the plurality of target positions, the control apparatus 120 can determine, as a representative value, the average value (data indicating the average value for each time) of the measurement results of the output responses obtained at the plurality of target positions.

Instead of the average value of the measurement results of the output responses, the control apparatus 120 may determine a statistic value such as the maximum value, the minimum value, the median value, or the like of the measurement results as a representative value. When setting an FF manipulated variable individually for each target position, the control apparatus 120 may determine, as a representative value, the average value or the like of the measurement results of the output responses obtained at the plurality of target positions, but it may determine a representative value individually for each target position. For example, the control apparatus 120 may determine (select), as a representative value, the measurement result of the output response obtained at the target position for which an FF manipulated variable is to be determined, out of the measurement results of the output responses obtained at the plurality of target positions.

In step S104, the control apparatus 120 determines a second manipulated variable based on the relationship between the first manipulated variable and the representative value of the output response determined in step S103. The second manipulated variable is a manipulated variable obtained by combining (coupling) the first manipulated variable and a coefficient (gain) that can differ at each of a plurality of times by multiplying the first manipulated variable by the coefficient. Based on an assumption that the first manipulated variable and the representative value of the output response change in a linear relationship, the control apparatus 120 predicts the output response of the substrate stage 114 that can be obtained when the second manipulated variable is given to the substrate stage 114. Then, an approximate calculation for adjusting the coefficient at each time is performed such that the difference between the predicted output response of the substrate stage 114 and a target response falls within an allowable range (preferably, the difference becomes zero), thereby determining the second manipulated variable.

The target response is, for example, the control error of the substrate stage 114 with respect to each time obtained when only feedback control is performed (the graph as shown in FIG. 2B). The target response can include the output response (control error) of the substrate stage 114 in a period from the arrival time of the substrate stage 114 to the target position (time 300 in FIG. 2B) to the settling time of the substrate stage 114 (time 450 in FIG. 2B). However, the target response is not limited to the period from the arrival time to the settling time, and may include the output response of the substrate stage 114 in other periods.

There is a case in which, due to the high-frequency component included in the output response (for example, the impulse response shown in FIG. 5B) of the substrate stage 114 obtained when the first manipulated variable is given thereto, the error does not converge in the approximate calculation for determining the second manipulated variable so the second manipulated variable cannot be correctly obtained. In this case, the control apparatus 120 may apply a filtering process such as a low-pass filter or a window function to the output response of the substrate stage 114.

In step S105, the control apparatus 120 determines an FF manipulated variable based on the second manipulated variable determined in step S104. For example, the control apparatus 120 determines, as the FF manipulated variable, the manipulated variable obtained by reversing the manipulation direction (that is, the direction in which the substrate stage 114 is to be driven) of the second manipulated variable determined in step S104. By giving the FF manipulated variable thus determined to the substrate stage 114 together with the feedback manipulated variable, it is possible to reduce (cancel) the control error of the substrate stage 114. Therefore, the settling time of the substrate stage 114 can be shortened. The data of the determined FF manipulated variable is stored in the memory 126.

A specific method for determining the second manipulated variable in step S104 and setting the FF manipulated variable in step S105 will be described below in detail.

First, the control apparatus 120 acquires a result (actual measurement value) obtained by measuring a control error $e(t)$ of the substrate stage 114 in a state in which no FF manipulated variable is given to the substrate stage 114. Then, the control apparatus 120 determines a time section (for example, time 331 to time 420) for performing an exposure process, and extracts, from the control error $e(t)$, control error data in the time section for the exposure process. At this time, when the sampling time is 1, control error data $e_0$ to be extracted includes 90 samples, and expressed as:

$$e_0 = [e_1 e_2 \ldots e_{90}]^T \quad (1)$$

Next, as shown in FIGS. 5A and 5B, the control apparatus 120 gives an FF manipulated variable $\Delta f(t)$ to the substrate stage 114 at given time, and acquires the result (actual measurement value) obtained by measuring a response $\Delta y(t)$ of the substrate stage 114. The control apparatus 120 extracts, from the response $\Delta y(t)$ of the substrate stage 114, response data in the time section for the exposure process, Response data $y_0$ extracted in this manner is expressed by:

$$y_0 = [y_{1,0} y_{2,0} \ldots y_{90,0}]^T \quad (2)$$

The data so far is the actual measurement value, but from here, virtual data is generated. It is assumed that when the FF manipulated variable $\Delta f(t)$ is given to the substrate stage 114, and a similar manipulated variable is given to the substrate stage 114 after one sample, a similar response can be obtained, Let y be the response at this time. Similarly, let $y_2, y_3, \ldots y_n$ be the response after two samples, the response after three samples, . . . , the response after n samples, respectively. These responses are expressed as:

$$[y_0 \ y_1 \ \ldots \ y_n] = \begin{bmatrix} y_{1,0} & y_{1,1} & \cdots & y_{1,n} \\ y_{2,0} & y_{2,1} & \cdots & y_{2,n} \\ \vdots & \vdots & \ddots & \vdots \\ y_{90,0} & y_{90,1} & \cdots & y_{90,n} \end{bmatrix} \quad (3)$$

If a linear relationship exists between the manipulated variable given to the substrate stage 114 and the response of the substrate stage 114, the response to an FF manipulated variable $g\Delta f(t)$ is a response $g\Delta y(t)$. Therefore, letting $g_n$ be the gain of the FF manipulated variable after n samples, the following equation holds:

$$[g_0 y_0 \ g_1 y_1 \ \ldots \ g_n y_n] = \begin{bmatrix} g_0 y_{1,0} & g_1 y_{1,1} & \cdots & g_n y_{1,n} \\ g_0 y_{2,0} & g_1 y_{2,1} & \cdots & g_n y_{2,n} \\ \vdots & \vdots & \ddots & \vdots \\ g_0 y_{90,0} & g_1 y_{90,1} & \cdots & g_n y_{90,n} \end{bmatrix} \quad (4)$$

Next, the control apparatus 120 estimates the response of the substrate stage 114 obtained when all the FF manipulated variables after n samples are given to the substrate stage 114. Letting Y be the response data in the time section for the exposure process extracted from the responses, Y is a sum of n responses. Accordingly, the following equation holds:

$$Y = \begin{bmatrix} Y_1 \\ Y_2 \\ \vdots \\ Y_{90} \end{bmatrix} = \begin{bmatrix} g_0 y_{1,0} + g_1 y_{1,1} + \ldots + g_n y_{1,n} \\ g_0 y_{2,0} + g_1 y_{2,1} + \ldots + g_n y_{2,n} \\ \vdots \\ g_0 y_{90,0} + g_1 y_{90,1} + \ldots + g_n y_{90,n} \end{bmatrix} = \quad (5)$$

$$\begin{bmatrix} y_{1,0} & y_{1,1} & \cdots & y_{1,n} \\ y_{2,0} & y_{2,1} & \cdots & y_{2,n} \\ \vdots & \vdots & \ddots & \vdots \\ y_{90,0} & y_{90,1} & \cdots & y_{90,n} \end{bmatrix} \begin{bmatrix} g_0 \\ g_1 \\ \vdots \\ g_n \end{bmatrix}$$

In order to remove the control error (control error data $e_0$) in the time section for the exposure process by giving the FF manipulated variable to the substrate stage 114, it suffices if the response data Y is equal to the control error data $e_0$. Accordingly, the gain $g_n$ of the FF manipulated variable is obtained using a pseudo inverse matrix like:

$$e_0 = Y \quad (6)$$

$$\begin{bmatrix} e_0 \\ e_1 \\ \vdots \\ e_{90} \end{bmatrix} = \begin{bmatrix} y_{1,0} & y_{1,1} & \cdots & y_{1,n} \\ y_{2,0} & y_{2,1} & \cdots & y_{2,n} \\ \vdots & \vdots & \ddots & \vdots \\ y_{90,0} & y_{90,1} & \cdots & y_{90,n} \end{bmatrix} \begin{bmatrix} g_0 \\ g_1 \\ \vdots \\ g_n \end{bmatrix}$$

-continued $$\begin{bmatrix} g_0 \\ g_1 \\ \vdots \\ g_n \end{bmatrix} = \begin{bmatrix} y_{1,0} & y_{1,1} & \cdots & y_{1,n} \\ y_{2,0} & y_{2,1} & \cdots & y_{2,n} \\ \vdots & \vdots & \ddots & \vdots \\ y_{90,0} & y_{90,1} & \cdots & y_{90,n} \end{bmatrix}^{-1} \begin{bmatrix} e_0 \\ e_1 \\ \vdots \\ e_{90} \end{bmatrix}$$

The FF manipulated variable determined in accordance with the gain obtained as described above (that is, an FF manipulated variable $g_n \Delta f(t+t_n)$ obtained by multiplying an FF manipulated variable $\Delta f(t+t_n)$ by the determined gain $g_n$) is given to the substrate stage 114. This FF manipulated variable $g_n \Delta f(t+t_n)$ corresponds to the second manipulated variable. Then, based on the second manipulated variable, the control apparatus 120 determines an FF manipulated variable so as to cancel the error with respect to the substrate stage 114 (step S105).

Figure 6:
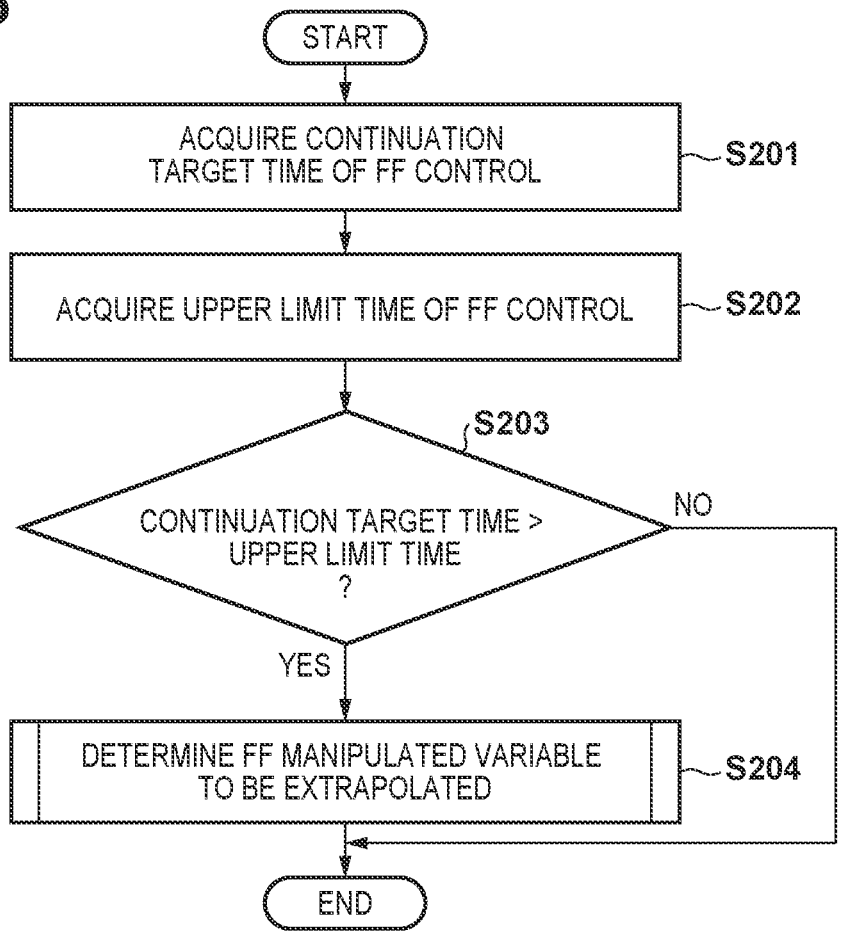
FIG. 6 is a flowchart showing a process of obtaining a feedforward manipulated variable to be extrapolated.

The contents of step S104 and step S105 have been described above in detail. Next, step S106 will be described. The above-described n responses correspond to the length of the time section for the exposure process. The time for the exposure process includes the processing time after completion of movement of the substrate stage. The processing time is determined in accordance with the operation method of the exposure apparatus. If the exposure apparatus is operated with settings that make the processing time longer than initially expected, FF manipulated variable data to be applied may run out. Therefore, in this embodiment, in step S106, if the duration of the feedforward control exceeds a predetermined time (preset time), the control apparatus 120 extrapolates an FF manipulated variable based on the FF manipulated variable obtained in step S105. With reference to FIG. 6, a process in step S106 will be described in detail.

In step S201, the control apparatus 120 acquires a continuation target time of FF control. The continuation target time can be determined based on at least one of the exposure amount, alignment settings, and the like. In step S202, the control apparatus 120 acquires the upper limit time (end) of the duration of the FF control. The upper limit time is a preset time (predetermined time) determined in accordance with the storage capacity of the memory 126 (storage unit) that stores FF manipulated variable data.

In step S203, the control apparatus 120 determines whether the continuation target time acquired in step S201 exceeds the upper limit time acquired in step S202. If the continuation target time does not exceed the upper limit time, this process is terminated. On the other hand, if the continuation target time exceeds the upper limit time, in step S204, the control apparatus 120 determines an FF manipulated variable after the end, which is to be extrapolated with respect to the FF manipulated variable.

Figure 7:
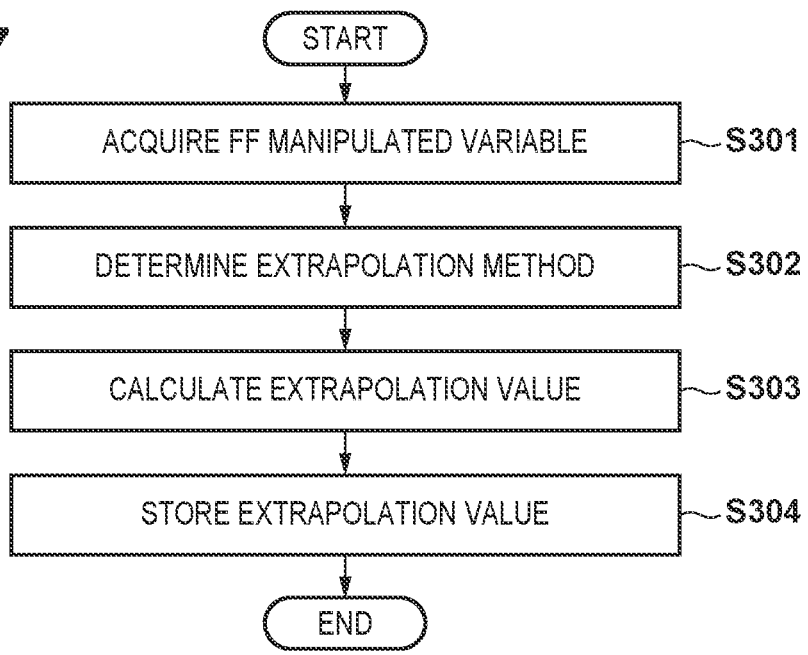
FIG. 7 is a flowchart showing a process of determining the FF manipulated variable to be extrapolated.
Figure 8:
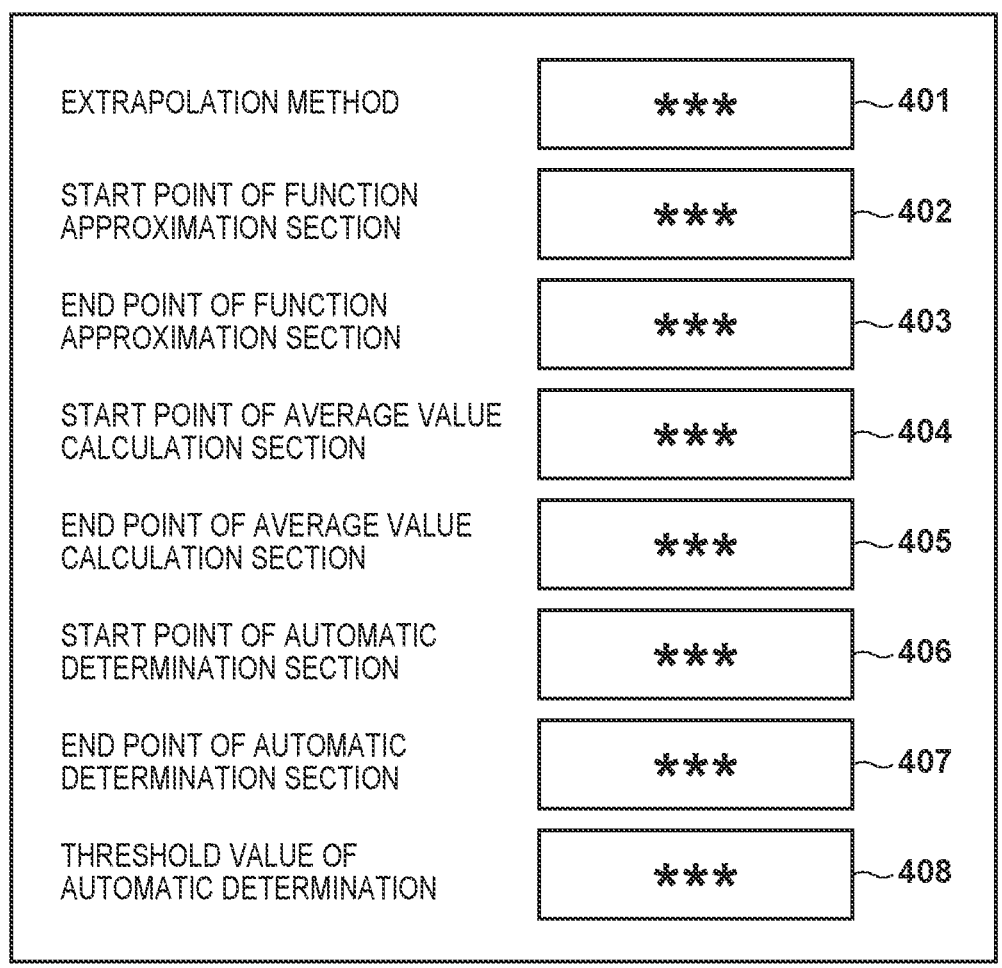
FIG. 8 is a view showing an example of a parameter setting screen.

With reference to FIG. 7, the process in step S204 will be described in detail. In step S301, the control apparatus 120 acquires the FF manipulated variable. More specifically, the control apparatus 120 reads out the FF manipulated variable data stored in the memory 126. In step S302, the control apparatus 120 determines an extrapolation method. In an example, the extrapolation method can be selected by a user operation. FIG. 8 shows an example of a parameter setting screen. The user can designate (select) the extrapolation method using a first designation portion 401. Candidate examples of the extrapolation method can include "function approximation", "continue the end value, and continue the average value near the end value", and "automatic determination". Hence, the first designation portion 401 functions as a selection portion for selecting one of a plurality of extrapolation methods in accordance with a user operation. In accordance with the determined extrapolation method, in step S303, the control apparatus 120 calculates an FF manipulated variable to be extrapolated. Thereafter, in step S304, the control apparatus 120 stores the calculated FF manipulated variable in the memory 126. At this time, the FF manipulated variable and the extrapolation method may be associated with each other and stored in the memory 126.

Note that the parameter setting screen shown in FIG. 8 can include designation items other than the extrapolation method. For example, in a second designation portion 402, the start point of a section for performing function approximation of the FF manipulated variable can be designated. In a third designation portion 403, the end point of a section for performing function approximation of the FF manipulated variable can be designated. In a fourth designation portion 404, the start point of a section for calculation of the average value of the FF manipulated variables can be designated. In a fifth designation portion 405, the end point of a section for calculation of the average value of the FF manipulated variables can be designated. In a sixth designation portion 406, the determination start point upon performing automatic determination of the extrapolation method of the FF manipulated variable can be designated. In a seventh designation portion 407, the determination end point upon performing automatic determination of the extrapolation method of the FF manipulated variable can be designated. In an eighth designation portion 408, the threshold value upon performing automatic determination of the extrapolation method of the FF manipulated variable can be designated.

Figure 9:
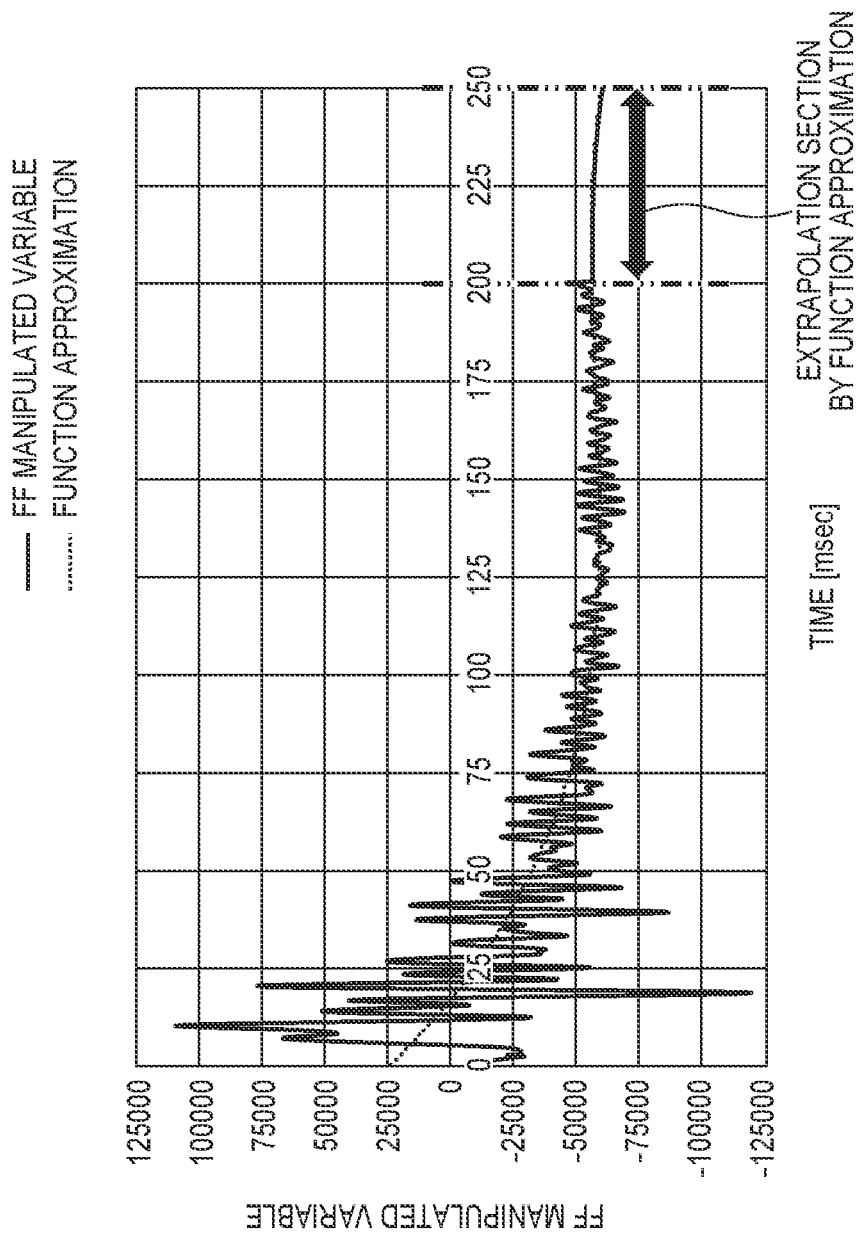
FIG. 9 is a graph showing an example of FF manipulated variable to be extrapolated, which is obtained by function approximation.

An example of a process of determining an FF manipulated variable to be extrapolated when "function approximation" (first method) is designated as the extrapolation method in the first designation portion 401 will be described. With respect to the time-series transition of the FF manipulated variables used in a predetermined section including the end of a time (predetermined time) set in advance for the duration of the FF control, the control apparatus 120 performs function approximation by, for example, a least-square method. Then, based on the function approximation, the control apparatus 120 predicts the FF manipulated variable after the predetermined time elapses (after the end). FIG. 9 shows an example of the FF manipulated variable to be extrapolated, which is obtained by function approximation. In FIG. 9, the FF manipulated variable in the section after 200 msec (after the predetermined time elapses) is predicted using function approximation (cubic) and extrapolated. The function approximation may be approximation using all samples of the FF manipulated variables, or approximation may be performed only in the section designated using the second designation portion 402 and the third designation portion 403 shown in FIG. 8.

Figure 10:
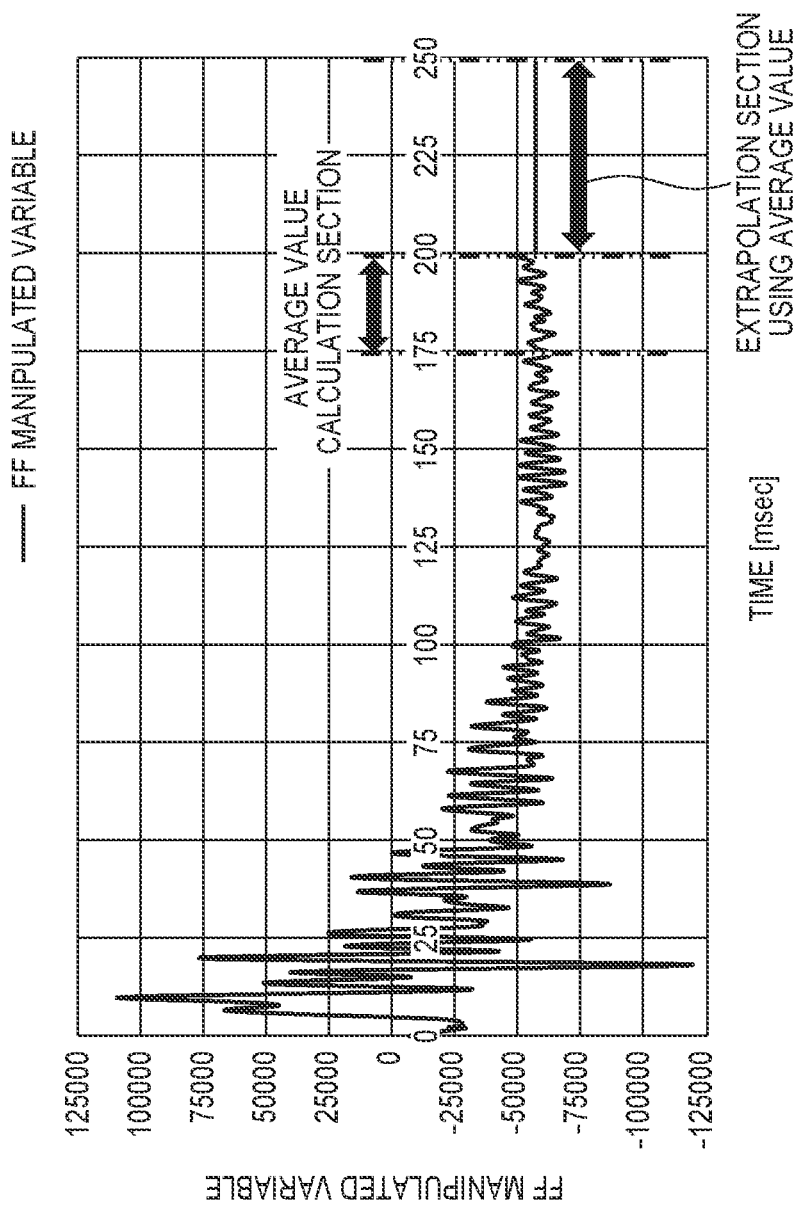
FIG. 10 is a graph showing an example in which an average value in a designated section is used as an FF manipulated variable to be extrapolated.

Next, an example of a process of determining an FF manipulated variable to be extrapolated when "continue the end value, and continue the average value near the end value" is designated in the first designation portion 401 will be described. The control apparatus 120 obtains the average value of the FF manipulated variables acquired in step S301 in a predetermined section including the end of a time (predetermined time) set in advance for the duration of the FF control. The predetermined section can be designated by the user via the fourth designation portion 404 and the fifth designation portion 405 shown in FIG. 8. The control apparatus 120 obtains the average value in the designated predetermined section, and obtains the average value as an FF manipulated variable to be extrapolated (an FF manipulated variable after the predetermined time elapses) (second method). FIG. 10 shows an example in which, when 175 is designated in the fourth designation portion 404 and 200 is designated in the fifth designation portion 405, the average value in a designated section from 175 to 200 is used as an FF manipulated variable to be extrapolated. Here, if 200 is designated in each of the fourth designation portion 404 and the fifth designation portion 405, the FF manipulated variable at the end is used as an FF manipulated variable to be extrapolated (an FF manipulated variable after the predetermined time elapses) (continue the end value (third method)).

Figure 11:
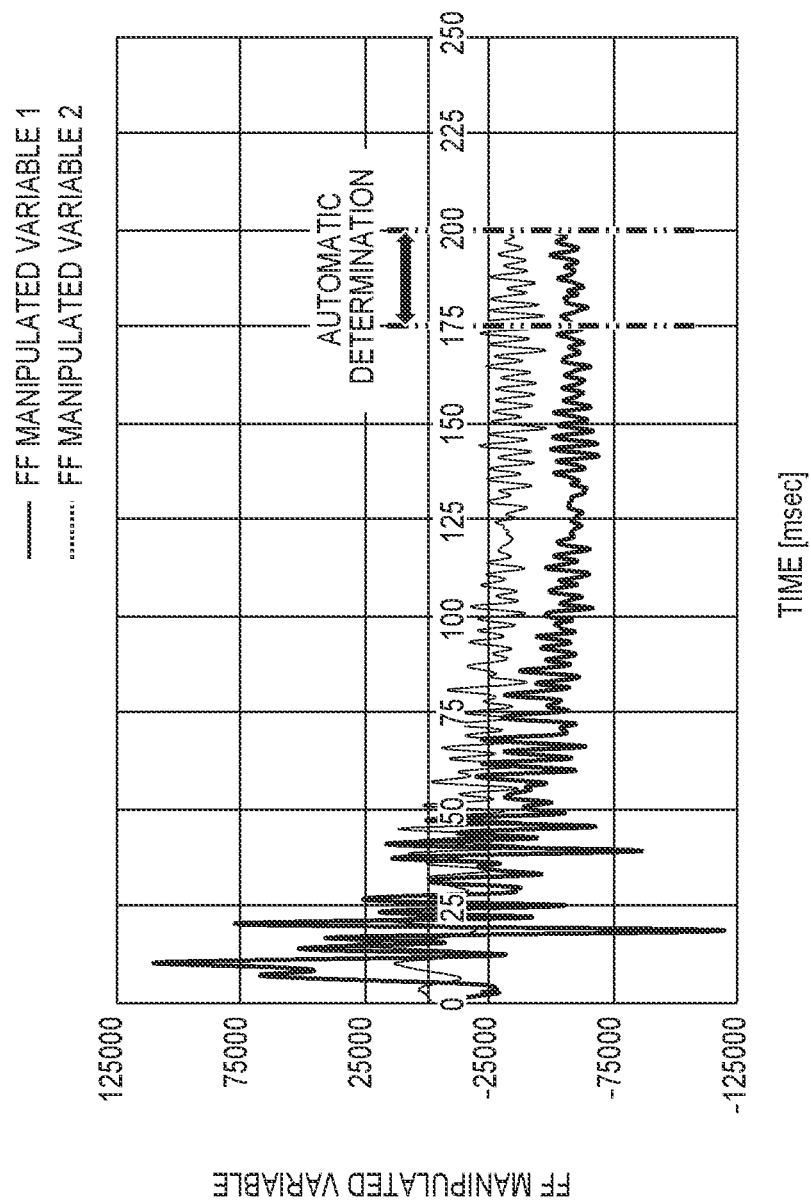
FIG. 11 is a graph for explaining automatic determination of an extrapolation method.
Figure 12:
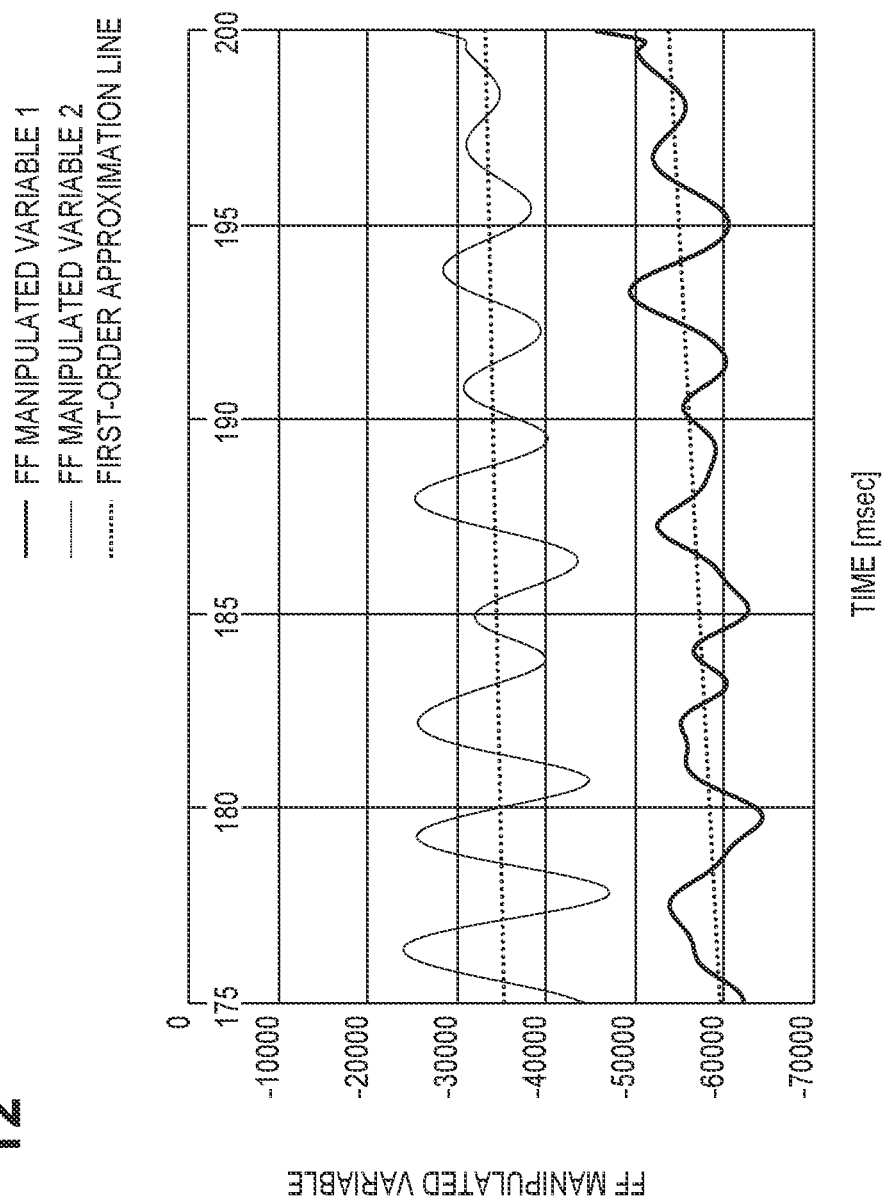
FIG. 12 is a graph for explaining the automatic determination of the extrapolation method.
Figure 13:
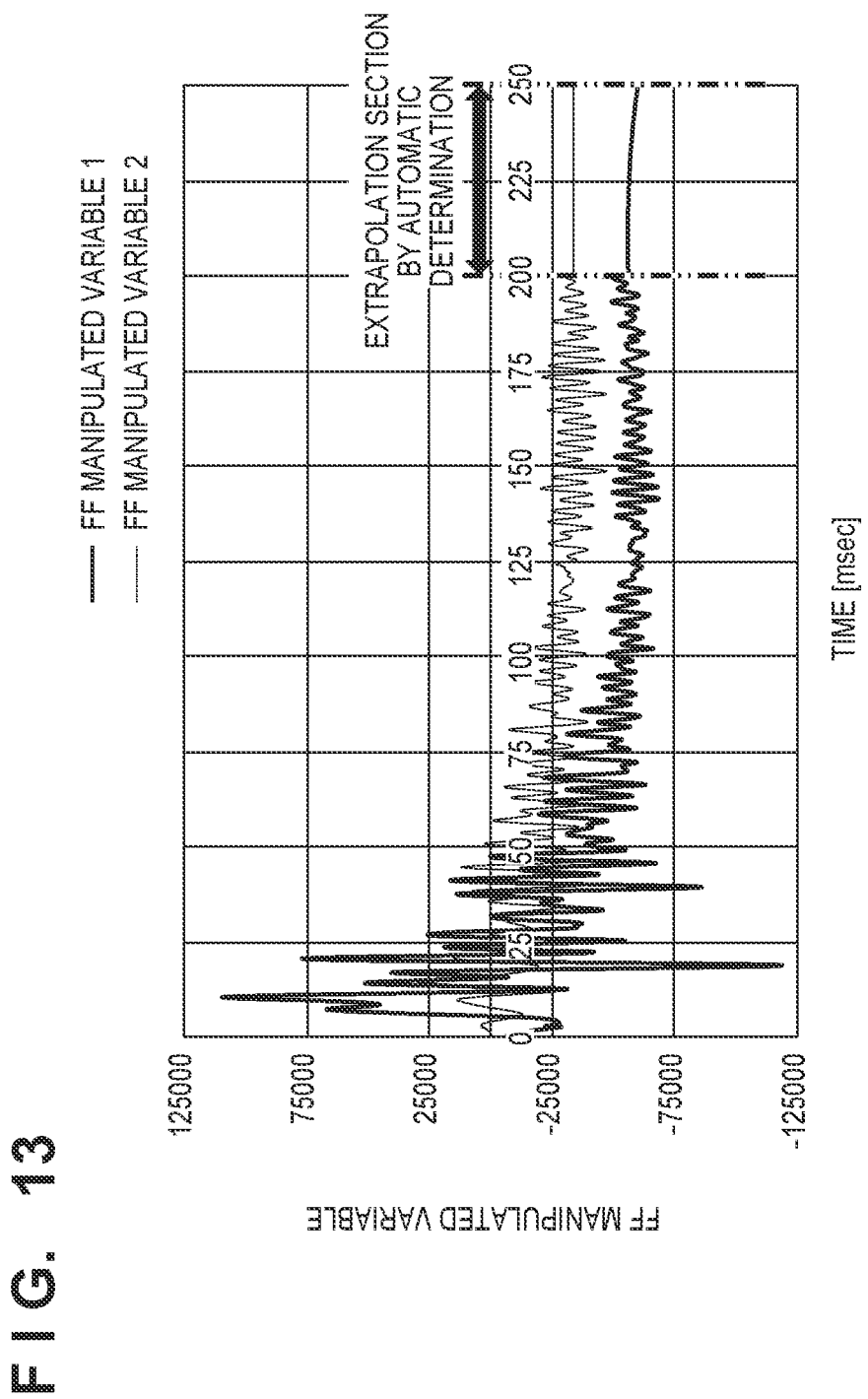
FIG. 13 is a graph for explaining the automatic determination of the extrapolation method.

Next, an example of a process of determining an FF manipulated variable to be extrapolated when "automatic determination" is designated in the first designation portion 401 will be described. The control apparatus 120 performs first-order approximation of, out of the FF manipulated variables acquired in step S301, the FF manipulated variables in a section designated using the sixth designation portion 406 and the seventh designation portion 407 shown in FIG. 8. The control apparatus 120 determines whether the slope of the straight line obtained by the first-order approximation is equal to or smaller than a threshold value designated in the eighth designation portion 408, if the slope is equal to or smaller than the threshold value, the control apparatus 120 determines the FF manipulated variable at the end as an FF manipulated variable to be extrapolated (continue the end value). If the slope is not equal to or smaller than the threshold value, an FF manipulated variable to be extrapolated is determined by function approximation. FIG. 11 shows examples of two kinds of FF manipulated variables in a case in which 175 and 200 are designated in the sixth designation portion 406 and the seventh designation portion 407 shown in FIG. 8, respectively. FIG. 12 shows examples of first-order approximation results in the designated section from 175 to 200 shown in FIG. 11. The slope of the primary component shown in FIG. 12 is compared with a threshold value designated in the eighth designation portion 408. As a result of the comparison, FIG. 13 shows the result by extrapolating the FF manipulated variable obtained by function approximation with respect to an FF manipulated variable 1, and the result obtained by continuing the end value with respect to an FF manipulated variable 2.

With the processes described above, the FF manipulated variable to be extrapolated is determined and stored in the memory 126. Thus, when controlling the substrate stage 114, the feedforward controller 124 performs FF control by using a plurality of FF manipulated variables for each time series obtained in advance and stored in the memory 126. If the duration of the FF control exceeds the preset time (predetermined time), the feedforward controller 124 continues the FF control by using the FF manipulated variable obtained based on the FF manipulated variables used in a predetermined section including the end of the predetermined time. As has been described above, an FF manipulated variable to be used after the predetermined time elapses is the feedforward manipulated variable obtained by extrapolation based on the feedforward manipulated variables used in the predetermined section.

FIG. 14A shows an example of a control error in a case in which FF control of the substrate stage is performed using an FF manipulated variable according to a related art, and the FF control expires since the continuation target time of the FF control exceeds the upper limit. FIG. 14B shows an example of the FF manipulated variable in this case. It can be seen that, if the FF control expires since the continuation target time of the FF control exceeds the upper limit as described above, a large control error occurs in a region surrounded by a dashed line.

Figure 15A:
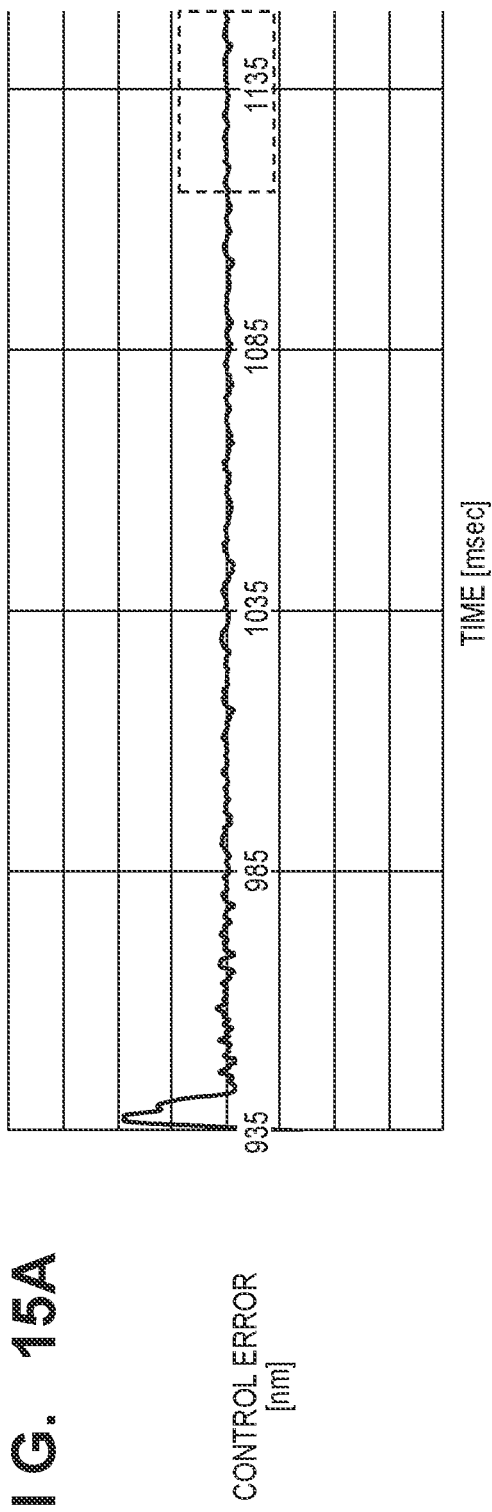
FIGS. 15A and 15B are graphs showing an example of a control error and an example of an FF manipulated variable, respectively, in a case in which FF control is continued using an extrapolated FF manipulated variable according to the embodiment.
Figure 15B:
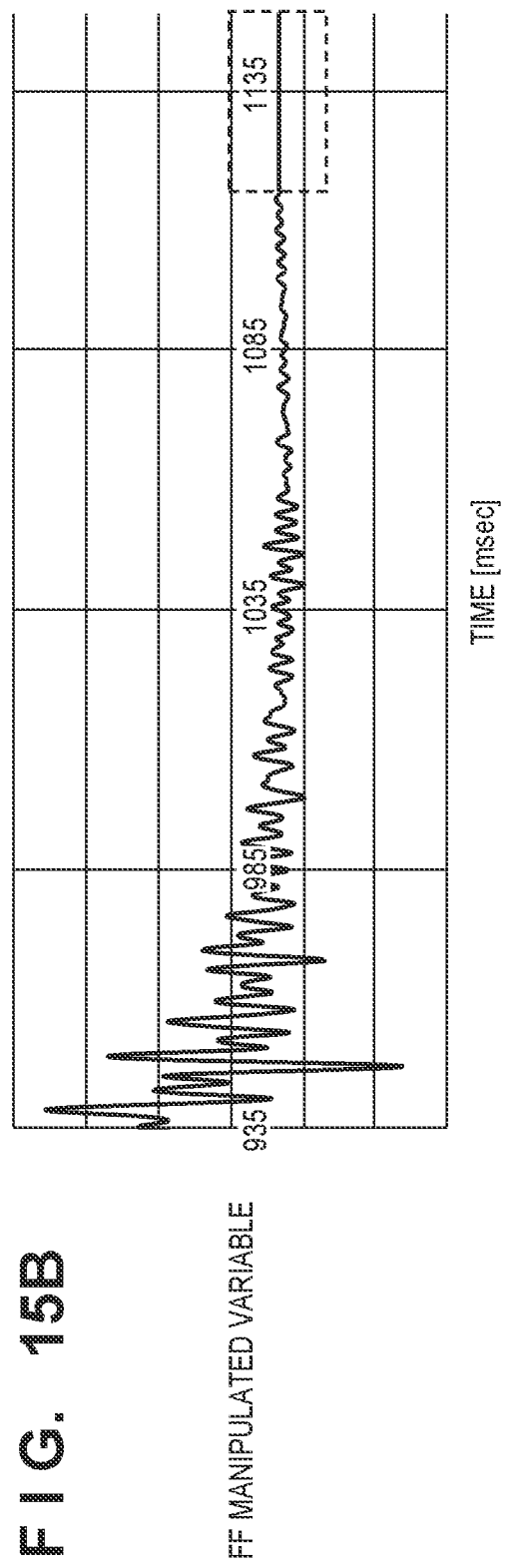

FIG. 15A shows an example of a control error in a case in which, after the continuation target time of FF control exceeds the upper limit, extrapolation of an FF manipulated variable is performed by continuing the end value according to this embodiment. FIG. 15B shows an example of the FF manipulated variable in this case. It can be seen that, even if the continuation target time of FF control exceeds the upper limit, the FF control is continued using the extrapolated FF manipulated variable, so that a small error is maintained even in a region surrounded by a dashed line.

Embodiment of Article Manufacturing Method

An article manufacturing method of manufacturing an article (for example, a semiconductor IC element, a liquid crystal display element, or a MEMS) using the above-described lithography apparatus will be described below. The article manufacturing method can be a method that includes a transfer step of transferring a pattern of an original onto a substrate using the lithography apparatus, and a processing step of processing the substrate having undergone the transfer step, thereby obtaining an article from the substrate having undergone the processing step.

When the lithography apparatus is an exposure apparatus, the article manufacturing method can include a step of exposing a substrate (a substrate, a glass substrate, or the like) coated with a photosensitive agent, a step of developing the substrate (photosensitive agent), and a step of processing the developed substrate in other known steps. The other known steps include etching, resist removal, dicing, bonding, and packaging. According to this article manufacturing method, a higher-quality article than a conventional one can be manufactured. When the lithography apparatus is an imprint apparatus, the article manufacturing method can include a step of forming a pattern made of a cured product of an imprint material by molding the imprint material on a substrate using a mold, and a step of processing the substrate using the pattern.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-135028, filed Aug. 20, 2021, which is hereby incorporated by reference herein in its entirety.

What is claimed is:

1. A control apparatus for performing position control of a moving object, the apparatus comprising
a feedforward controller configured to perform feedforward control by giving a manipulated variable to the moving object,
wherein in a case that the feedforward control continues exceeding a predetermined time, the feedforward controller continues the feedforward control using a second manipulated variable obtained by extrapolation based on a first manipulated variable used in a predetermined section until the predetermined time.

2. The apparatus according to claim 1, wherein
until the predetermined time, the feedforward controller uses a plurality of manipulated variables for each time series obtained in advance.

3. The apparatus according to claim 2, further comprising a storage unit configured to store the plurality of manipulated variables, and the second manipulated, wherein the predetermined time is a time determined in accordance with a storage capacity of the storage unit.

4. The apparatus according to claim 2, wherein the feedforward controller performs function approximation of a time-series transition of the first manipulated variables determines the second manipulated variable by the function approximation.

5. The apparatus according to claim 2, wherein the feedforward controller determines the second manipulated variable using an average value of the first manipulated variables.

6. The apparatus according to claim 2, wherein the feedforward controller determines the second manipulated variable using a manipulated variable used at the end of the predetermined time.

7. The apparatus according to claim 2, wherein the feedforward controller performs the extrapolation in accordance with to a method selected from a first method of performing function approximation of a time-series transition of the first manipulated variables, and determining the second manipulated variable by the function approximation, a second method of determining the second manipulated variable using an average value of the first manipulated variables, and a third method of determining the second manipulated variable using a manipulated variable used at the end of the predetermined time.

8. The apparatus according to claim 7, further comprising a selection unit configured to select one method of the first method, the second method, and the third method in accordance with a user operation.

9. The apparatus according to claim 2, wherein the feedforward controller performs first-order approximation of a time-series transition of the first manipulated variables, and determines whether a slope of a straight line obtained by the first-order approximation is not more than a threshold value, determines, in a case that the slope is not more than the threshold value, the extrapolation is performed by obtaining, the second manipulated variable using a manipulated variable used at the end of the predetermined time, and performs, in a case that the slope is more than the threshold value, function approximation of the time-series transition of the first manipulated variables, and determines the second manipulated variable by the function approximation.

10. The apparatus according to claim 1, further comprising a feedback controller configured to perform feedback control on the moving object so as to reduce a position error from a target position, wherein the feedforward controller performs the feedforward control on the moving object on which the feedback control is performed by the feedback controller.

11. A lithography apparatus for performing a process of transferring a pattern of an original onto a substrate, wherein a control apparatus defined in claim 1 is used to perform position control of a stage serving as a moving object which moves while holding the substrate.

12. An article manufacturing method comprising:

transferring a pattern of an original onto a substrate using a lithography apparatus defined in claim 11; and processing the substrate having undergone the transferring, wherein an article is obtained from the substrate having undergone the processing.

* * * * *